United States Patent [19]
Bishop

[11] Patent Number: 5,834,882
[45] Date of Patent: Nov. 10, 1998

[54] MULTI-LAYER PIEZOELECTRIC TRANSFORMER

[75] Inventor: Richard P. Bishop, Fairfax Station, Va.

[73] Assignee: Face International Corp., Norfolk, Va.

[21] Appl. No.: 864,029

[22] Filed: May 27, 1997

Related U.S. Application Data

[60] Provisional application No. 60/032,813, Dec. 11, 1996.
[51] Int. Cl.⁶ .................................................. H01L 41/07
[52] U.S. Cl. .......................... 310/359; 310/333; 310/363
[58] Field of Search ................................... 310/331–333, 310/359, 366, 363

[56] References Cited

U.S. PATENT DOCUMENTS

| | | | |
|---|---|---|---|
| 3,093,760 | 6/1963 | Tarasevich | 310/331 |
| 3,219,850 | 11/1965 | Langevin | 310/331 |
| 3,949,247 | 4/1976 | Fenner, et al. | 310/331 |
| 4,786,837 | 11/1988 | Kalnin et al. | 310/363 |
| 5,589,725 | 12/1996 | Haertling | 310/331 |
| 5,675,296 | 10/1997 | Tomikawa | 331/158 |

FOREIGN PATENT DOCUMENTS

| | | | |
|---|---|---|---|
| 55-146989 | 11/1980 | Japan | 310/332 |
| 5-175568 | 7/1993 | Japan | 310/332 |

*Primary Examiner*—Thomas M. Dougherty
*Attorney, Agent, or Firm*—Stephen E. Clark

[57] ABSTRACT

A multi-layer piezoelectric transformer device includes first and second electroactive members having electrodes bonded to each of their opposing major faces; and a bonding layer disposed therebetween. The first and second electroactive members are polarized in a thickness direction, between their two major faces, such that when energized by an electric field the first and second electroactive members longitudinally strain. The first and second electroactive members are arranged such that deformation of one electroactive member results in corresponding deformation of the other electroactive member. The device provides substantial transformation ratios in which relatively high power may be transferred in relation to the size of the unit, operability over wide input and output frequency bandwidths, and electrical isolation of the voltage and current at the input to the device from the voltage and current at the output of the device.

11 Claims, 6 Drawing Sheets

MULTI-LAYER PIEZOELECTRIC TRANSFORMER

BACKGROUND OF THE INVENTION

1. Field of Invention

The present invention relates to piezoelectric ceramic transformers. More particularly, the present invention relates to multi-layered piezoelectric ceramic transformers.

2. Description of the Prior Art

Wound-type electromagnetic transformers have been used for generating high voltage in internal power circuits of devices such as televisions or in charging devices of copier machines which require high voltage. Such electromagnetic transformers take the form of a conductor wound onto a core made of a magnetic substance. Because a large number of turns of the conductor are required to realize a high transformation ratio, electromagnetic transformers that are effective, yet at the same time compact and slim in shape are extremely difficult to produce.

To remedy this problem, piezoelectric transformers utilizing the piezoelectric effect have been provided in the prior art. In contrast to the general electromagnetic transformer, the piezoelectric ceramic transformer has a number of advantages. The size of a piezoelectric transformer can be made smaller than electromagnetic transformers of comparable transformation ratio. Piezoelectric transformers can be made nonflammable, and they produce no electromagnetically induced noise.

Figure 1:
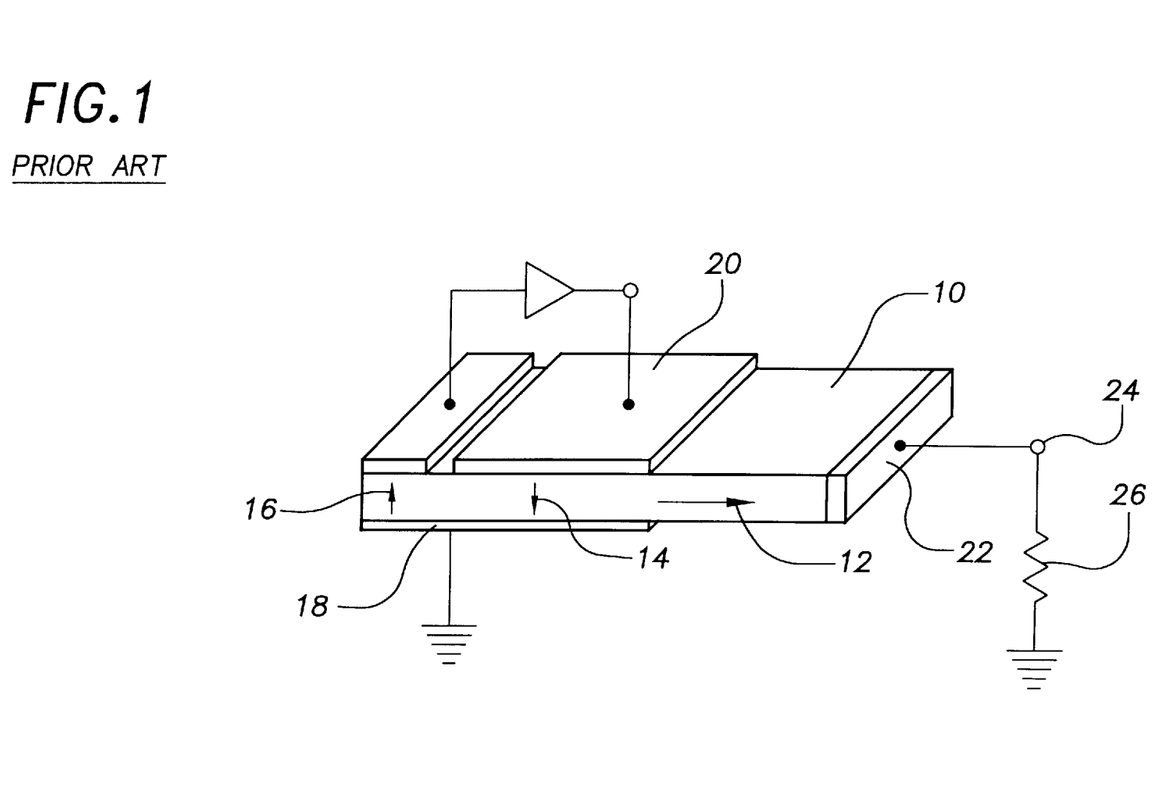
FIG. 1 is a perspective view showing the construction of a Rosen-type piezoelectric transformer of the prior art.

The ceramic body employed in prior piezoelectric transformers take various forms and configurations, including rings, flat slabs and the like. A typical example of a prior piezoelectric transformer is illustrated in FIG. 1. This type of piezoelectric transformer is commonly referred to as a "Rosen-type" piezoelectric transformer. The basic Rosen-type piezoelectric transformer was disclosed in U.S. Pat. No. 2,830,274 to Rosen, and numerous variations of this basic apparatus are well known in the prior art. The typical Rosen-type piezoelectric transformer comprises a flat ceramic slab 10 which is appreciably longer than it is wide and substantially wider than thick. As shown in FIG. 1, a piezoelectric body 10 is employed having some portions polarized differently from others. In the case of FIG. 1, the piezoelectric body 10 is in the form of a flat slab which is considerably wider than it is thick, and having greater length than width. A substantial portion of the slab 10, the portion 12 to the right of the center of the slab is polarized longitudinally, whereas the remainder of the slab is polarized transversely to the plane of the face of the slab. In this case the remainder of the slab is actually divided into two portions, one portion 14 being polarized transversely in one direction, and the remainder of the left half of the slab, the portion 16 also being polarized transversely but in the direction opposite to the direction of polarization in the portion 14.

In order that electrical voltages may be related to mechanical stress in the slab 10, electrodes are provided. If desired, there may be a common electrode 18, shown as grounded. For the primary connection and for relating voltage at opposite faces of the transversely polarized portion 14 of the slab 10, there is an electrode 20 opposite the common electrode 18. For relating voltages to stress generated in the longitudinal direction of the slab 10, there is a secondary or high-voltage electrode 22 cooperating with the common electrode 18. The electrode 22 is shown as connected to a terminal 24 of an output load 26 grounded at its opposite end.

In the arrangement illustrated in FIG. 1, a voltage applied between the electrodes 18 and 20 is stepped up to a high voltage between the electrodes 18 and 22 for supplying the load 26 at a much higher voltage than that applied between the electrodes 18 and 20.

A problem with prior piezoelectric transformers is that they are difficult to manufacture because individual ceramic elements must be "poled" at least twice each, and the direction of the poles must be different from each other.

Another problem with prior piezoelectric transformers is that they are difficult to manufacture because it is necessary to apply electrodes not only to the major faces of the ceramic element, but also to at least one of the minor faces of the ceramic element.

Another problem with prior piezoelectric transformers is that they are difficult to manufacture because, in order to electrically connect the transformer to an electric circuit, it is necessary to attach (i.e. by soldering or otherwise) electrical conductors (e.g. wires) to electrodes on the major faces of the ceramic element as well as on at least one minor face of the ceramic element.

Another problem with prior piezoelectric transformers is that the voltage output of the device is limited by the ability of the ceramic element to undergo deformation without cracking or structurally failing. It is therefore desirable to provide a piezoelectric transformer which is adapted to deform under high voltage conditions without damaging the ceramic element of the device.

SUMMARY OF THE INVENTION

The term piezoelectric transformer is here applied to a passive electrical energy-transfer device employing the piezoelectric properties of two co-joined materials to achieve the transformation of voltage or current or impedance. It is an object of the invention to provide a piezoelectric transformer which is not only capable of substantial transformation ratios, but in which relatively high power may be transferred in relation to the size of the unit.

Accordingly, it is a primary object of the present invention to provide a piezoelectric transformer which may be easily and inexpensively produced.

It is another object of the present invention to provide a device of the character described which is capable of producing high voltages and which may safely be used in high voltage circuits.

It is another object of the present invention to provide a piezoelectric transformer of the character described comprising a pair of ceramic elements, each exhibiting piezoelectric properties, which are in physical (mechanical) communication with each other such that deformation of one ceramic element results in corresponding deformation of the other ceramic element.

It is another object of the present invention to provide a piezoelectric transformer of the character described which is easy to manufacture because it is sufficient to pole each ceramic element only once, and wherein the direction of poling for each ceramic element is constant over its entire mass.

It is another object of the present invention to provide a piezoelectric transformer of the character described which is easy to manufacture because it is sufficient to apply electrodes only to the major faces of the ceramic elements, and which do not require application of electrodes to minor faces of the ceramic elements.

It is another object of the present invention to provide a piezoelectric transformer of the character described which is easy to manufacture because it is sufficient to apply electrodes only to two parallel faces of the ceramic elements.

It is another object of the present invention to provide a piezoelectric transformer of the character described which is easy to connect or install in an electric circuit, because it is sufficient to attach (i.e. by soldering or otherwise) electrical conductors (e.g. wires) only to electrodes on the major faces of the ceramic element.

It is another object of the present invention to provide a piezoelectric transformer of the character described which is adapted to deform under high voltage conditions without damaging the ceramic element of the device.

It is another object of the present invention to provide a piezoelectric transformer of the character described which is operable over wide input and output frequency bandwidths.

It is another object of the present invention to provide a piezoelectric transformer of the character described which electrically isolates the voltage and current at the input to the device from the voltage and current at the output of the device.

Further objects and advantages of my invention will become apparent from a consideration of the drawings and ensuing description thereof.

DESCRIPTION OF THE PREFERRED EMBODIMENT

Figure 2:
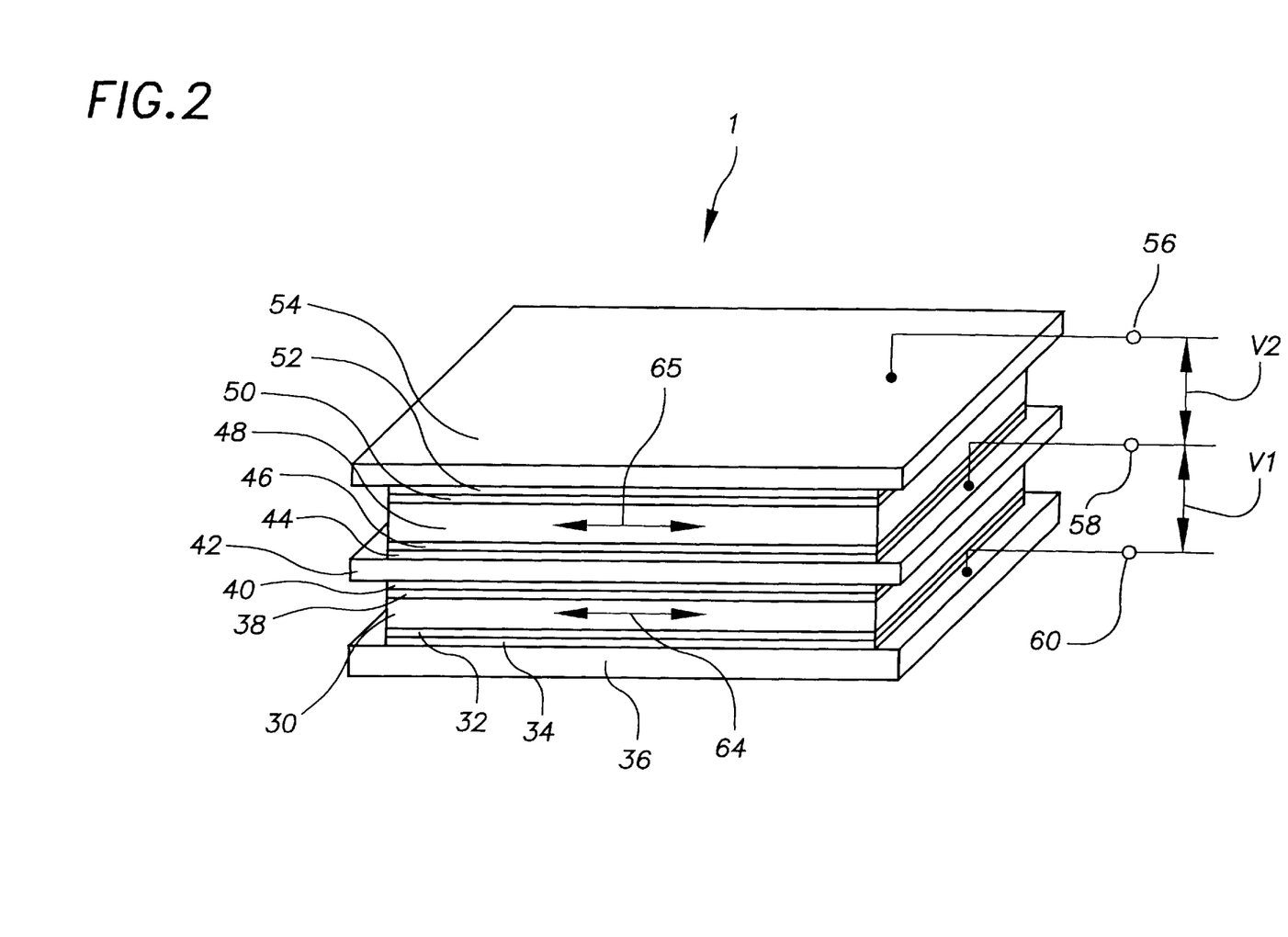
FIG. 2 is a perspective view showing the preferred embodiment of a piezoelectric transformer constructed in accordance with the present invention.

In the preferred embodiment of the invention, a piezoelectric transformer (generally designated 1) is manufactured by stacking and bonding together a number of laminate layers as illustrated in FIG. 2 and as will be more fully described below.

A first piezoelectric ceramic wafer 30 is preferably in the form of a slab having two substantially parallel major faces which are each electroplated 32 and 38.

A second piezoelectric ceramic wafer 48 is preferably in the form of a slab having two substantially parallel major faces which are each electroplated 46 and 50.

A first pre-stress layer 36 is positioned adjacent one electroplated surface 32 of the first piezoelectric ceramic wafer 30. An adhesive layer 34 is disposed between the first pre-stress layer 36 and the adjacent electroplated surface 32 of the first piezoelectric ceramic wafer 30 for purposes of bonding the two members (i.e. the first pre-stress layer 36 and the first piezoelectric ceramic wafer 30) together. The first pre-stress layer 36 is preferably a conductive material (preferably metal) having a coefficient of thermal expansion/ contraction which is greater than that of the material of the first ceramic wafer 30.

A second pre-stress layer 42 is positioned adjacent the other electroplated surface 38 of the first piezoelectric ceramic wafer 30. An adhesive layer 40 is disposed between the second pre-stress layer 42 and the adjacent electroplated surface 38 of the first piezoelectric ceramic wafer 30 for purposes of bonding the two members (i.e. the second pre-stress layer 42 and the first piezoelectric ceramic wafer 30) together. The second pre-stress layer 42 is preferably a conductive material (preferably metal) having a coefficient of thermal expansion/contraction which is greater than that of the material of the first ceramic wafer 30.

An electroplated surface 46 of the second piezoelectric ceramic wafer 48 is positioned adjacent the second pre-stress layer 42, such that the second pre-stress layer 42 is between the two ceramic wafers 30 and 48, as shown in FIG. 2. An adhesive layer 44 is disposed between the second pre-stress layer 42 and the adjacent electroplated surface 46 of the second piezoelectric ceramic wafer 48 for purposes of bonding the two members (i.e. the second pre-stress layer 42 and the second piezoelectric ceramic wafer 48) together. The first pre-stress layer 36 is preferably has a coefficient of thermal expansion/contraction which is greater than that of the material of the second ceramic wafer 48.

A third pre-stress layer 54 is positioned adjacent the other electroplated surface 50 of the second piezoelectric ceramic wafer 48. An adhesive layer 52 is disposed between the third pre-stress layer 54 and the adjacent electroplated surface 50 of the second piezoelectric ceramic wafer 48 for purposes of bonding the two members (i.e. the third pre-stress layer 54 and the second piezoelectric ceramic wafer 48) together. The third pre-stress layer 54 is preferably a conductive material (preferably metal) having a coefficient of thermal expansion/ contraction which is greater than that of the material of the second ceramic wafer 48.

During manufacture of the transformer 1 the entire stack of laminate layers (i.e. the two ceramic wafers 30 and 48, the three pre-stress layers 36, 42 and 54, and the four adhesive layers 34, 40, 44 and 52) are arranged as described herein above and as illustrated in FIG. 2, and simultaneously heated to a temperature above the melting point of the adhesive materials 34, 40, 44 and 52. In the preferred embodiment of the invention the adhesive material used in the four adhesive layers 34, 40, 44 and 52 is LaRC-SI™ adhesive, as developed by NASA-Langley Research Center and commercially marketed by IMITEC, Inc. of Schenectady, N.Y. LaRC-SI™ adhesive, which has a melting point above 300 deg. C., is a very strong adhesive and has a coefficient of thermal contraction which is greater than that of most ceramics (and, in particular, is preferably greater than that of the materials of the two ceramic wafers 30 and 48). While LaRC-SI™ adhesive is used in the preferred embodiment of the invention, it is within the scope of the present invention to use other adhesives, provided they have a melting point below that of the other laminate layers of the transformer (i.e. the two ceramic wafers 30 and 48, and the three pre-stress layers 36, 42 and 54), are capable of hardening to apply a bond between the respective pre-stress layers 36, 42 and 54 and the ceramic wafers 30 and 48 sufficient to transfer longitudinal stresses between adjacent layers of the transformer 1.

After the entire stack of laminate layers (i.e. the two ceramic wafers 30 and 48, the three pre-stress layers 36, 42 and 54, and the four adhesive layers 34, 40, 44 and 52) have been heated to a temperature above the melting point of the adhesive materials 34, 40, 44 and 52, the entire stack of laminate layers (i.e. the two ceramic wafers 30 and 48, the three pre-stress layers 36, 42 and 54, and the four adhesive layers 34, 40, 44 and 52) are then permitted to cool to ambient temperature. As the temperature of the laminate layers (i.e. the two ceramic wafers 30 and 48, the three pre-stress layers 36, 42 and 541 and the four adhesive layers 34, 40, 44 and 52) falls below the melting temperature of the adhesive materials 34, 40, 44 and 52, the four adhesive layers 34, 40, 44 and 52 solidify, bonding them to the adjacent layers. During the cooling process the ceramic wafers 30 and 48 become compressively stressed along their longitudinal axes due to the relatively higher coefficients of thermal contraction of the materials of construction of the pre-stress layers 36, 42 and 54.

It will be understood that a piezoelectric transducer 1 constructed in accordance with the preceding description comprises a pair of longitudinally pre-stressed (i.e. compressed) piezoelectric ceramic wafers which are intimately bonded to each other (albeit separated by laminated adhesive and pre-stress layers) along one of their major faces.

Figure 3:
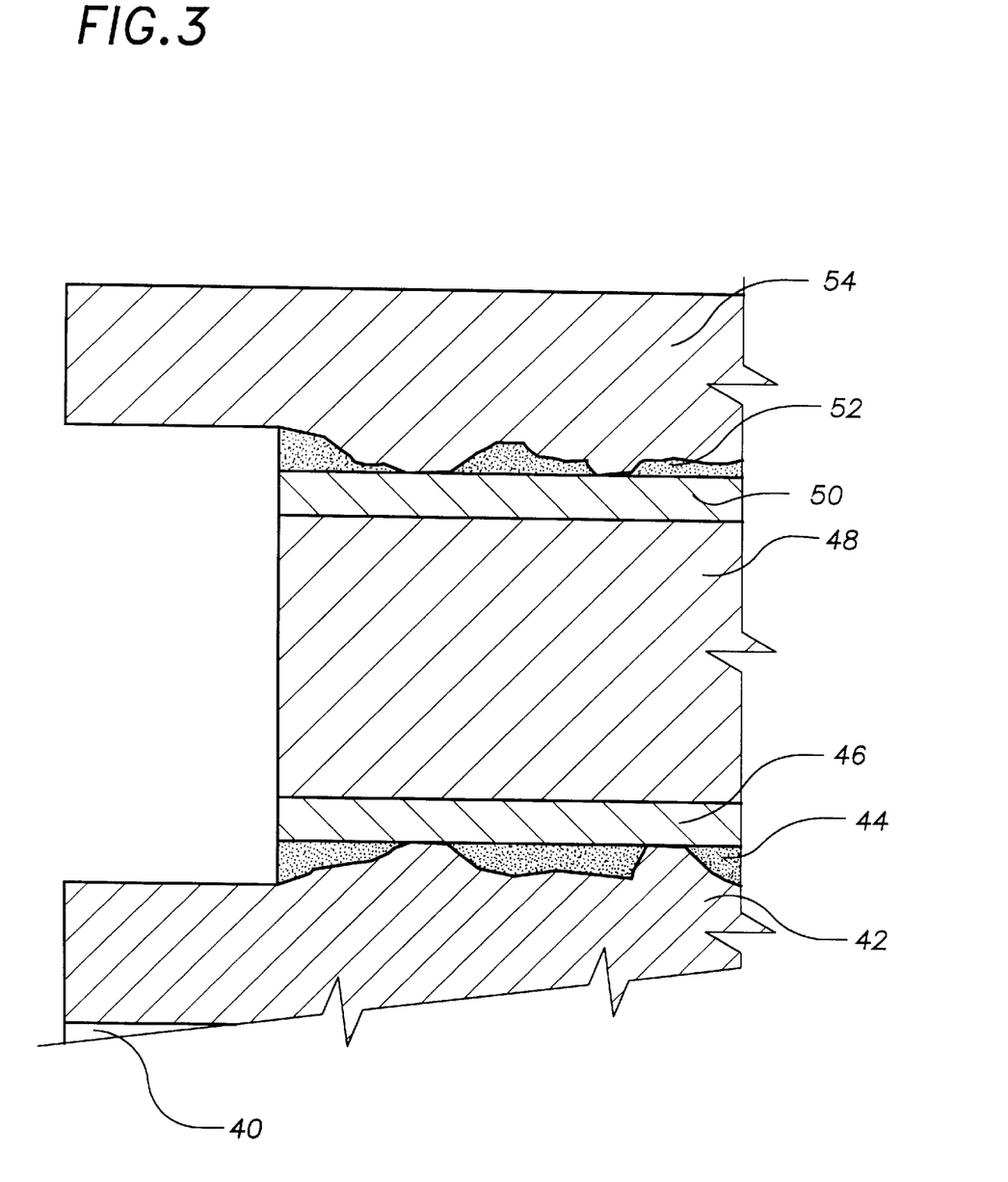
FIG. 3 is a cross-sectional elevational view showing details of the construction of the laminate layers of the invention.

As discussed above, in the preferred embodiment of the invention the four adhesive layers 34, 40, 44 and 52) preferably comprise LaRC-SI™ adhesive. LaRC-SI™ adhesive is a dielectric. Therefore, in the preferred embodiment of the invention it is desirable to roughen the surfaces of the three pre-stress layers 36, 42 and 54 which are in contact with the four adhesive layers 34, 40, 44 and 52 (as illustrated in FIG. 3), so that the pre-stress layers 36, 42 and 54 may electrically conduct to the corresponding electroplated surfaces 32, 38, 46 and 50 of the respective ceramic wafers 30 and 48.

In the preferred embodiment of the invention the pre-stress layers 36, 42 and 54, and the four adhesive layers 34, 40, 44 and 52 are longer than the two ceramic wafers 30 and 48 and, accordingly, protrude beyond the ends of the ceramic members. Electric terminals 56, 58 and 60 are connected (e.g. by wire and solder, or other common means) to an exposed surface of the pre-stress layers 54, 42 and 36, respectively.

In the preferred embodiment of the invention the three pre-stress layers 36, 42 and 54, and the four adhesive layers 34, 40, 44 and 52 each compressively stress the two ceramic members 30 and 48. By compressive stressing the two ceramic members 30 and 48, the ceramic members 30 and 48 are less susceptible to damage (i.e. cracking and breaking).

Figure 4:
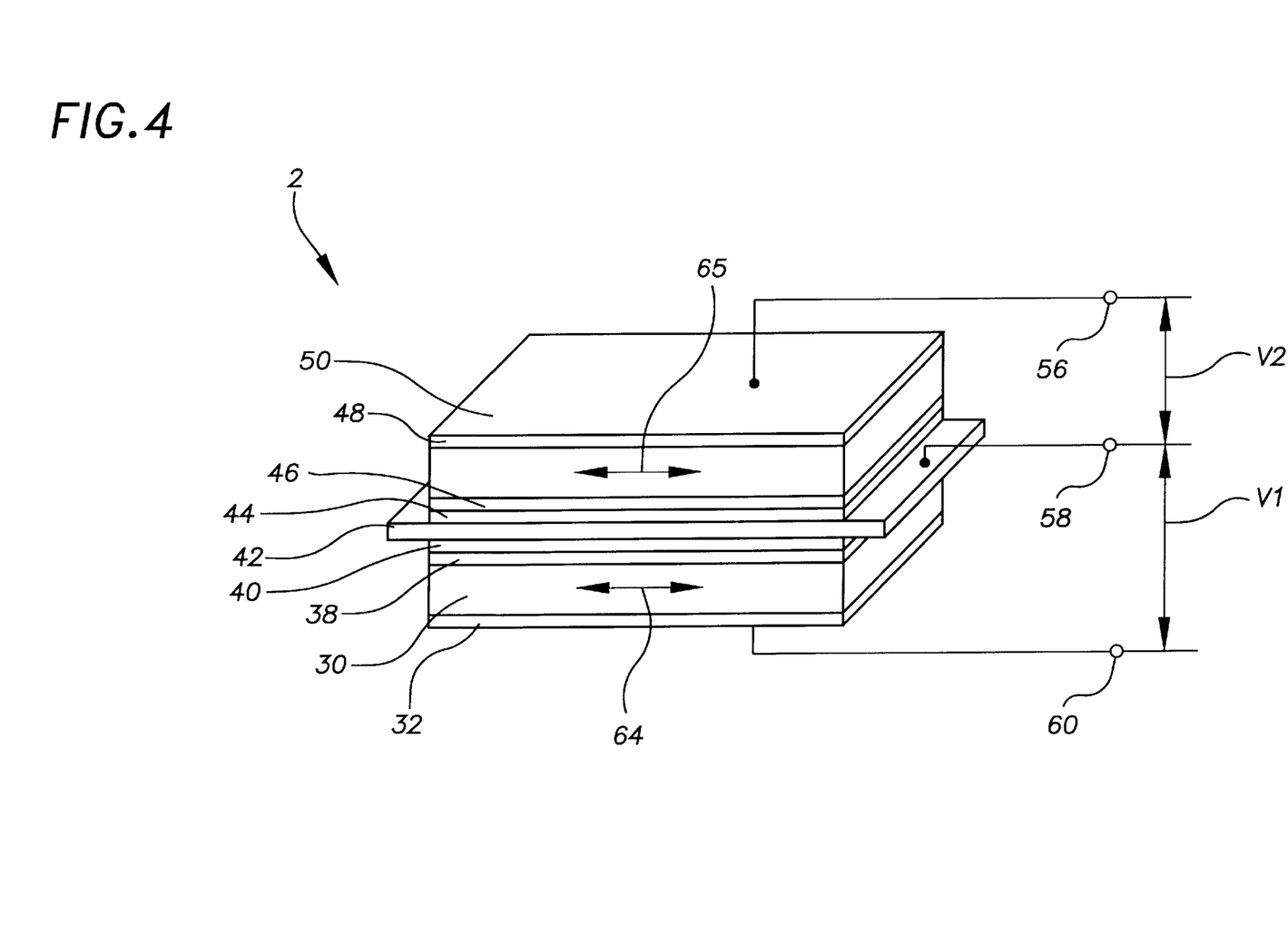
FIG. 4 is a perspective view of a modified embodiment of the invention.

FIG. 4 illustrates the construction of a modified piezoelectric transformer 2 which is similar to that of the preferred embodiment of the invention (FIG. 2), less the two outboard pre-stress layers 36 and 54 and adhesive layers 34 and 52.

Figure 5:
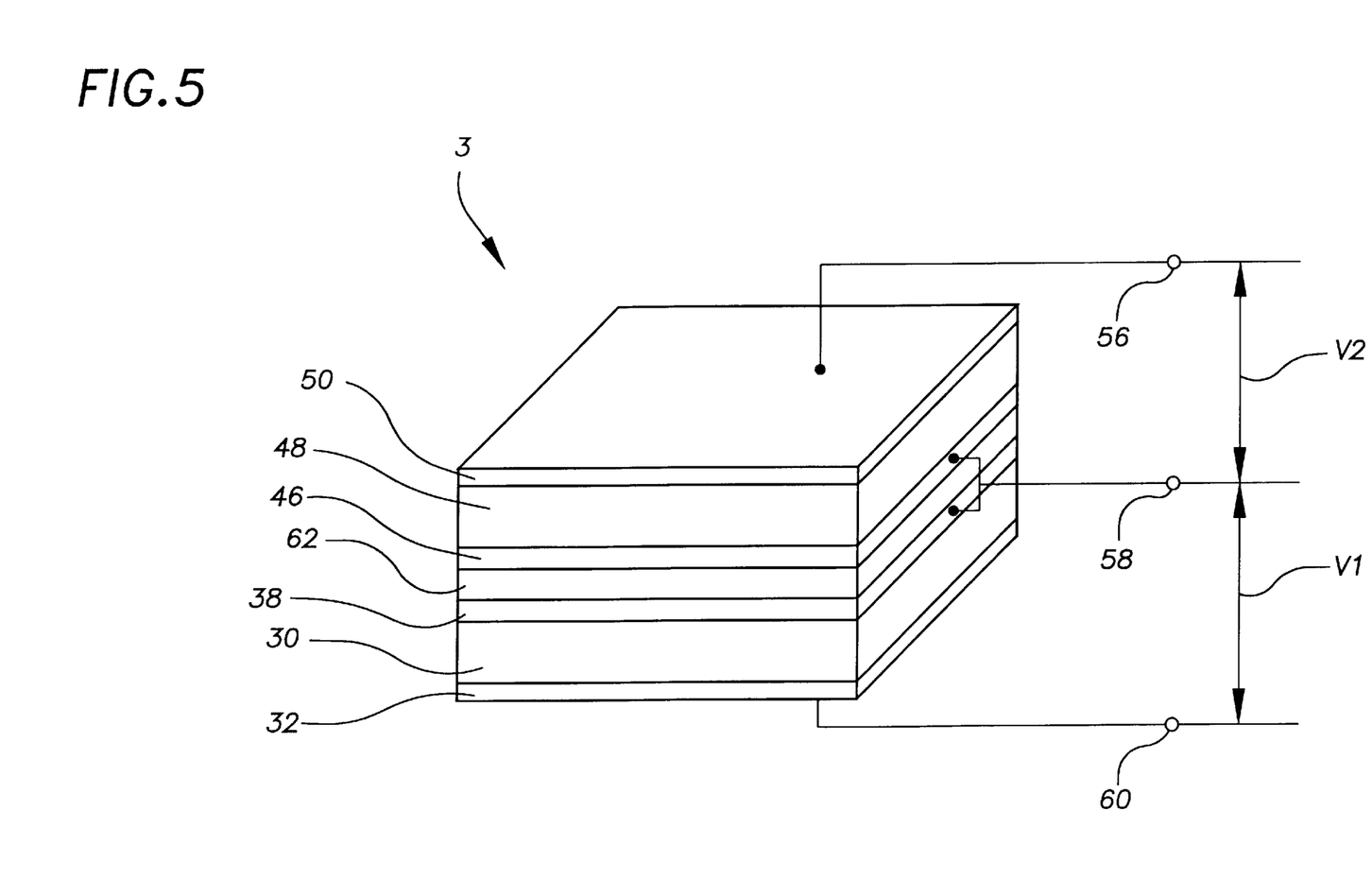
FIG. 5 is a perspective view of a modified embodiment of the invention.

FIG. 5 illustrates the construction of another modified piezoelectric transformer 3. In this modified piezoelectric transformer 3 two piezoelectric wafers 30 and 48, having parallel electroplated surfaces 32, 38, 46 and 50 are bound together at two adjacent major faces of the wafers.

In the preferred embodiment of the piezoelectric transformer 1 and the two modified piezoelectric transformer 2 and 3, each of the ceramic wafers 30 and 48 is poled in one direction. More specifically, in the preferred embodiment of the piezoelectric transformer 1 and the two modified piezoelectric transformer 2 and 3, each of the ceramic wafers 48 and 30 is poled such that when a voltage potential is applied across the corresponding electrodes 46 and 50, or 32 and 38 on its respective major faces, the wafer will longitudinally strain. Conversely, in the preferred embodiment of the piezoelectric transformer 1 and the two modified piezoelectric transformer 2 and 3, each of the ceramic wafers 48 and 30 is poled such that when either of the ceramic wafers 30 is longitudinally strained a voltage potential is generated between the corresponding electrodes 46 and 50, or 32 and 38, on its respective major faces.

OPERATION

Referring now to FIG. 2: When a primary (i.e. input) voltage V1 is applied across terminals 58 and 60 connected to the electrodes 32 and 38 of the first ceramic wafer 30, the first ceramic wafer 30 will piezoelectrically generate an extensional stress commensurate with the magnitude of the input voltage V1, the piezoelectric properties of the wafer 30 material, the size and geometry of the wafer 30 material, and the elasticity of the other materials of the other laminate layers (i.e. the ceramic wafer 48, the three pre-stress layers 36, 42 and 54, and the four adhesive layers 34, 40, 44 and 52) which are bonded to the first wafer 30. The extensional stress which is generated by the input voltage V1 causes the first ceramic wafer 30 to be longitudinally strained, (for example as indicated by arrow 64).

Because the first ceramic wafer 30 is securely bonded to the second ceramic wafer 48 (i.e. by adhesive layers 40 and 44), any longitudinal strain 64 of the first ceramic wafer 30 will result in a longitudinal strain (of the same magnitude and direction) in the second ceramic wafer 48 (as indicated by arrow 65). The longitudinal strain 65 of the second piezoelectric ceramic wafer 48 generates a voltage potential V2 across the two electroplated surfaces 46 and 50 of the second ceramic wafer 48. The electric terminals 58 and 56 may be electrically connected to corresponding electroplated surfaces 46 and 50 of the second ceramic wafer 48. The magnitude of the piezoelectrically generated voltage V2 between the two electrodes 46 and 50 of the second ceramic wafer 48 depends upon the piezoelectric properties of the wafer 48 material, the size, geometry and poling of the wafer 48 material.

It will therefore be appreciated that by applying a first voltage V1 across the electroplated 32 and 38 major surfaces of the first ceramic wafer 30, the first ceramic wafer 30 is caused to longitudinally strain 64, which, in turn, causes the second ceramic wafer 48 to longitudinally strain 65 a like amount, which, in turn produces a second voltage potential V2 between the electroplated 46 and 50 major surfaces of the second ceramic wafer 48.

It will be understood that ratio of the first voltage V1 to the second voltage V2 is a function of the piezoelectric properties of the wafer 30 and 48, the size and geometry of the wafers 30 and 48 material, the elasticity of the other materials of the other laminate layers (i.e. the ceramic wafers 30 48, the three pre-stress layers 36, 42 and 54, and the four adhesive layers 34, 40, 44 and 52), and the poling characteristics of the two ceramic wafers 30 and 48. It will also be understood that the first voltage V1 may alternatively be either an "input" voltage or an "output" voltage, and the second voltage V2 may respectively be either an "output" voltage or an "input" voltage.

Figure 6:
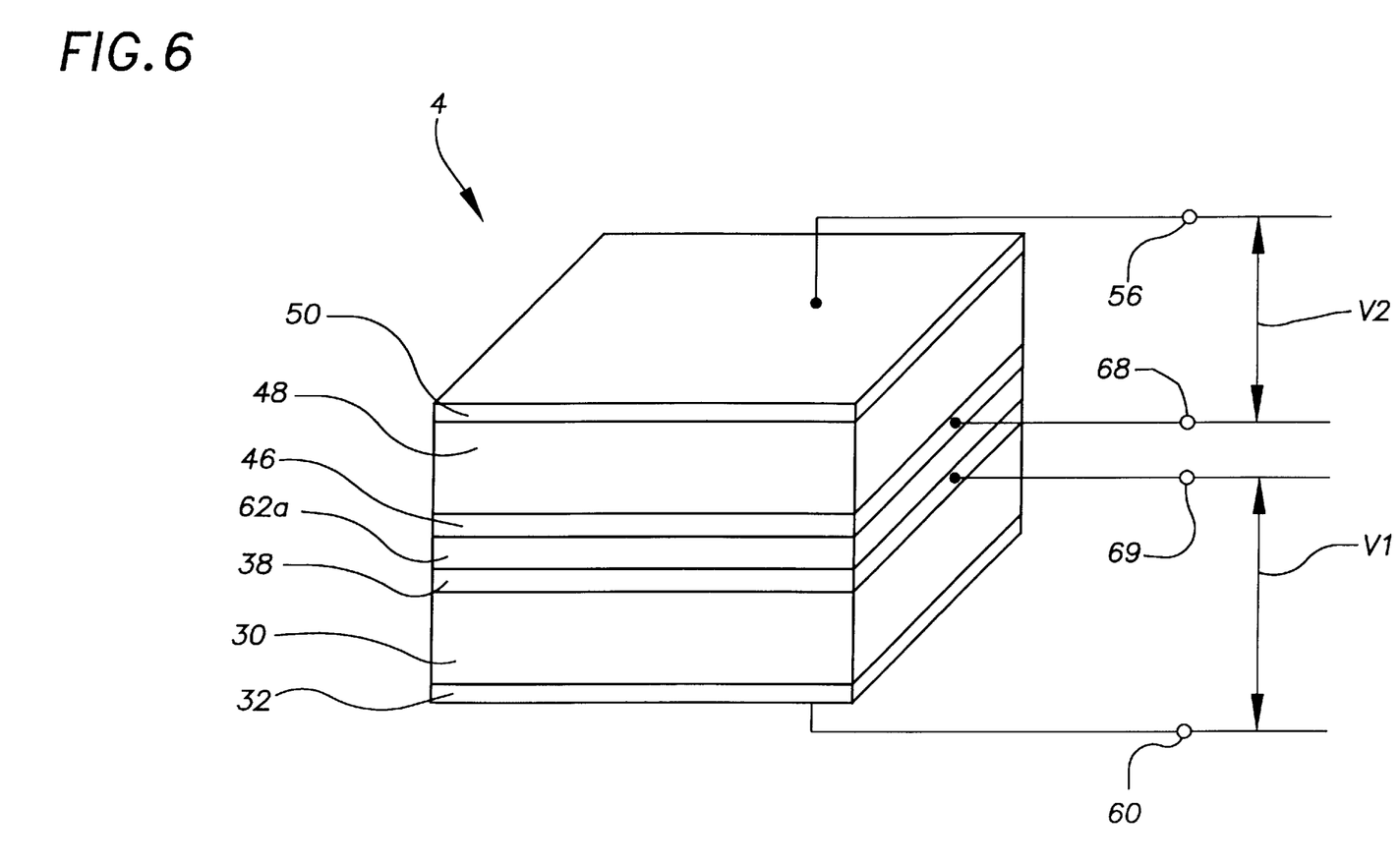
FIG. 6 is a perspective view of a modified embodiment of the invention.

In the preferred embodiment of the invention the corresponding facing electroplated surfaces 38 and 46 of the first ceramic wafer 30 and second ceramic wafer 48, respectively, are electrically connected to a common electric terminal 58. In an alternative embodiment of the transformer 4 (as shown in FIG. 6), the corresponding facing electroplated surfaces 38 and 46 of two ceramic wafers 30 and 48 are electrically insulated from each other, (for example by a dielectric adhesive layer 62a ), and connected to corresponding terminals 69 and 68. It will be appreciated that in this modified embodiment of the transformer 4 the two piezoelectric ceramic wafers 30 and 48 are completely electrically isolated from each other. Thus it will be understood that a transformer 4 constructed in accordance with this modification of the invention may be used in an electric circuit to electrically protect electrical components "downstream" from the transformer 4 from damage from high current discontinuities "upstream" of the transformer 4.

While the above description contains many specificities, these should not be construed as limitations on the scope of the invention, but rather as an exemplification of one preferred embodiment thereof. Many other variations are possible, for example:

- The various laminate layers (i.e. the ceramic wafers 30 and 48, the pre-stress layers 36, 42 and 54, and the adhesive layers 34, 40, 44 and 52) may be bonded to each other without sequentially heating and cooling so as to pre-stress the ceramic members;
- The two ceramic wafers 30 and 48 may be constructed of either similar or dissimilar piezoelectric materials which may either have identical or dissimilar piezoelectric coefficients;
- The two ceramic wafers 30 and 48 may either be of equal or unequal thicknesses; and
- The adhesive layers (34, 40, 44, 52) may either be electrically conductive or non-conductive.

Accordingly, the scope of the invention should be determined not by the embodiment illustrated, but by the appended claims and their legal equivalents.

I claim:

1. A transformer comprising:
   a first electroactive member having two opposing major faces which are disposed on the opposite sides of a first longitudinal axis;
   a second electroactive member having two opposing major faces which are disposed on the opposite sides of a second longitudinal axis;
   wherein an electrode is bonded to each of said two opposing major faces of said first electroactive member;
   and wherein an electrode is bonded to each of said two opposing major faces of said second electroactive member;
   said first electroactive member being polarized transversely in a thickness direction between said two opposing major faces of said first electroactive member, such that said first electroactive member longitudinally strains when a voltage is applied across said two opposing major faces of said first electroactive member;
   said second electroactive member being polarized transversely in a thickness direction between said two opposing major faces of said second electroactive member, such that said second electroactive member longitudinally strains when a voltage is applied across said two opposing major faces of said second electroactive member, said second electroactive member being polarized in a direction substantially parallel to said first electroactive member;
   wherein said first electroactive member is mechanically bonded to said second electroactive member by a bonding layer, said bonding layer being disposed between a first major face of said first electroactive member and a first major face of said second electroactive member.

2. The device according to claim 1,
   wherein said first and second electroactive members comprise a piezoelectric material.

3. The device according to claim 2,
   wherein said bonding layer comprises a first electrically conductive member.

4. The device according to claim 3,
   wherein said bonding layer further comprises a second electrically conductive member, and a dielectric layer, wherein said dielectric layer is disposed between said first and second electrically conductive members and wherein said first electrically conductive member is in electrical communication with said first major face of said first electroactive member and said second electrically conductive member is in electrical communication with said first major face of said second electroactive member.

5. The device according to claim 1,
   wherein said bonding layer comprises pre-stressing means for applying a longitudinal compressive stress to said first and second electroactive members.

6. The device according to claim 5,
   wherein said pre-stressing means comprise a thermoplastic copolyimide material having a melting point above 100 degrees Celsius.

7. The device according to claim 6,
   wherein said pre-stressing means further comprises a first electrically conductive member.

8. The device according to claim 7,
   wherein said pre-stressing means further comprises a second electrically conductive member, and a dielectric layer, wherein said dielectric layer is disposed between said first and second electrically conductive members and wherein said first electrically conductive member is in electrical communication with said first major face of said first electroactive member and said second electrically conductive member is in electrical communication with said first major face of said second electroactive member.

9. The device according to claim 7,
   further comprising a pre-stress layer bonded to a second surface of said first electroactive member, wherein said pre-stress layer applies a longitudinal compressive stress to said first electroactive member or wherein said pre-stress layer is bonded to a second surface of said second electroactive member, wherein said pre-stress layer applies a longitudinal compressive stress to said second electroactive member.

10. The device according to claim 9,
    wherein said pre-stress layer comprises a thermoplastic copolyimide material having a melting point above 100 degrees Celsius.

11. The device according to claim 10,
    wherein said pre-stress layer further comprises a third electrically conductive member.

* * * * *